(12) United States Patent
Tran et al.

(10) Patent No.: US 7,518,872 B2
(45) Date of Patent: Apr. 14, 2009

(54) ATTACHING HEAT SINKS TO PRINTED CIRCUIT BOARDS USING PRELOADED SPRING ASSEMBLIES

(75) Inventors: Donald T. Tran, Phoenix, AZ (US); Ed Unrein, Steilacoom, WA (US)

(73) Assignee: Intel Corporation, Santa Clara, CA (US)

( * ) Notice: Subject to any disclaimer, the term of this patent is extended or adjusted under 35 U.S.C. 154(b) by 852 days.

(21) Appl. No.: 10/881,788

(22) Filed: Jun. 30, 2004

(65) Prior Publication Data

US 2006/0002089 A1 Jan. 5, 2006

(51) Int. Cl.
*H05K 7/20* (2006.01)
*A41F 1/00* (2006.01)
*A47B 97/00* (2006.01)

(52) U.S. Cl. .............. 361/704; 361/719; 257/718; 248/510; 24/458

(58) Field of Classification Search .......... 361/704, 361/719; 257/718, 727, 719; 165/80.3, 185; 174/16.1, 16.3
See application file for complete search history.

(56) References Cited

U.S. PATENT DOCUMENTS

| | | | | |
|---|---|---|---|---|
| 5,648,889 | A * | 7/1997 | Bosli | 361/704 |
| 5,883,782 | A * | 3/1999 | Thurston et al. | 361/704 |
| 5,894,408 | A * | 4/1999 | Stark et al. | 361/704 |
| 6,008,990 | A * | 12/1999 | Liu | 361/704 |
| 6,046,905 | A * | 4/2000 | Nelson et al. | 361/704 |
| 6,097,601 | A * | 8/2000 | Lee | 361/704 |
| 6,154,365 | A * | 11/2000 | Pollard et al. | 361/704 |
| 6,243,266 | B1 * | 6/2001 | Lo | 361/704 |
| 6,307,747 | B1 * | 10/2001 | Farnsworth et al. | 361/704 |
| 6,515,871 | B1 * | 2/2003 | Stark et al. | 361/818 |
| 6,560,113 | B1 * | 5/2003 | Ma | 361/719 |
| 6,714,414 | B1 * | 3/2004 | Dubovsky et al. | 361/704 |
| 6,731,505 | B1 * | 5/2004 | Goodwin et al. | 361/719 |
| 6,746,270 | B2 * | 6/2004 | Peterson et al. | 439/487 |
| 6,885,557 | B2 * | 4/2005 | Unrein | 361/704 |

* cited by examiner

*Primary Examiner*—Boris L Chervinsky
(74) *Attorney, Agent, or Firm*—Trop, Pruner & Hu, P.C.

(57) ABSTRACT

A bottom loaded assembly for securing heat sinks to printed circuit boards may use a preloaded spring. The preloaded spring may be positioned on one side of the printed circuit board and the heat sink may be positioned on the opposite side.

16 Claims, 2 Drawing Sheets

ATTACHING HEAT SINKS TO PRINTED CIRCUIT BOARDS USING PRELOADED SPRING ASSEMBLIES

BACKGROUND

This invention relates generally to securing heat sinks to printed circuit boards.

An integrated circuit may develop sufficient heat during operation that it needs to be cooled. To this end, finned heat sinks may be secured to integrated circuits for cooling purposes. Because the heat sinks tend to be large, they may be mounted directly to the printed circuit board on which the integrated circuit is also mounted.

The performance of integrated circuits, such as processors, is increasing. As their performance increases, the amount of heat integrated circuits generate may increase and this may result in the need for heat sinks of increasing size. Conventionally, a heat sink is mounted on the motherboard and the enabling load is applied from the heat sink side towards the chassis in what is called "top loading."

In a bottom loading design, the heat sink is mounted on the printed circuit board and the enabling load is applied from below, from the chassis toward the heat sink.

One problem with bottom loading designs is that the printed circuit board may be bent upwardly by the enabling load. Excessive board deflection may be undesirable because it may result in solder joint cracking between board and board mounted components. In addition, in some designs, there may be relatively limited room between the printed circuit board and the chassis on which the printed circuit board is mounted. The bottom loading configuration must fit into whatever available space is provided.

Thus, there is a need for improved, bottom loading heat sink attachment solutions.

DETAILED DESCRIPTION

Figure 1:
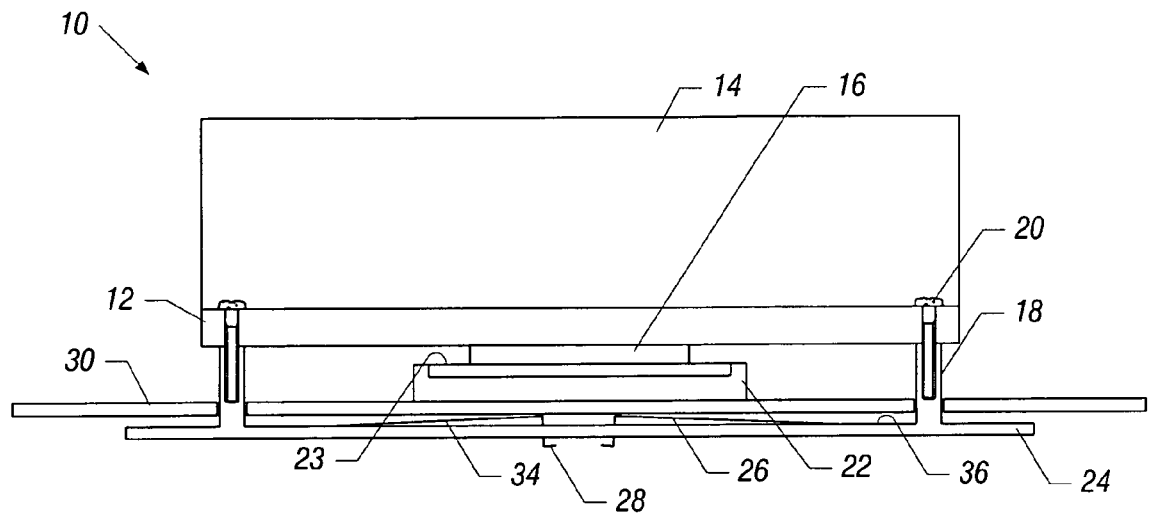
FIG. 1 is an enlarged, cross-sectional view of one embodiment of the present invention.

Referring to FIG. 1, an electronic device 10 may include a printed circuit board 30. The printed circuit board 30 may be a motherboard that receives a processor. A socket 22 couples an integrated circuit 23 electrically and mechanically to the printed circuit board 30. A heat spreader 16 may distribute heat from the integrated circuit 23 to the heat sink base 12 and, ultimately, to heat sink fins 14 to reduce the temperature of the integrated circuit 23.

The heat sink base 12 may be secured to the printed circuit board 30 by pins 18. The pins 18 may be secured above the heat sink base 12 by way of threaded fasteners 20. The fasteners 20 may be threaded downwardly from above. The pins 18 may pass freely through the board 30 and are secured to a spring assembly 26 below the board 30.

The enabling load is applied to the heat sink base 12 via the loaded spring assembly 26 positioned underneath the printed circuit board 30. The assembly 26 may include a plurality of cantilevered leaf spring arms 34 mounted on a base 36.

In one embodiment, the spring assembly 26 may be formed of two stamped metal sheets. The sheets may be made of different materials. For example, the spring arms 34 may be made of more resilient metal and the base 36 may be made of more rigid material.

Figure 2:
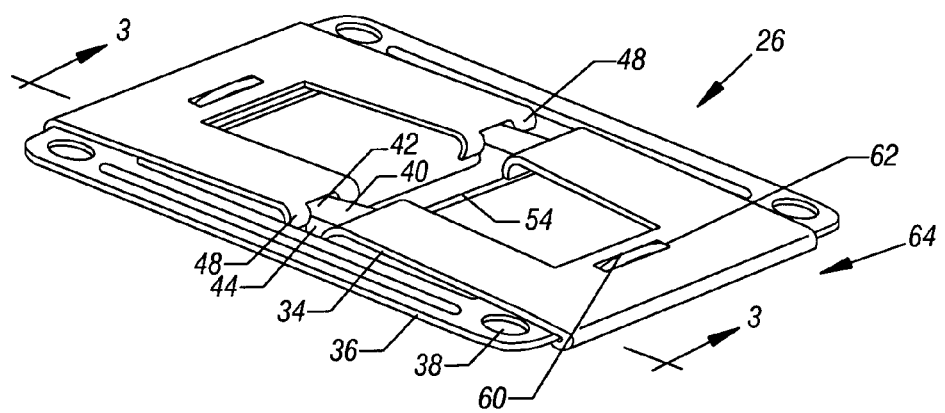
FIG. 2 is a perspective view of a preloaded spring assembly in accordance with one embodiment of the present invention.

Referring to FIG. 2, the preloaded spring assembly 26 may include a plurality of cantilevered spring arms 34 that are mounted onto a base 36. The base 36 may include a generally rectangular configuration, punctuated by openings 38 to receive the pins 18.

A cross bar 54 may extend across the center, in the length direction, of the base 36. The cross bar 54 may have upwardly offset or raised sections 44 near each edge. Each raised section 44 may have opposed, outwardly extending prongs 42. The prongs 42 guide the up and down movement of the spring arms 34 in one embodiment. In particular, the spring arms 34 have a pair of downwardly directed spaced apart fingers 48. A prong 42 extends between the fingers 48 to prevent side-to-side displacement of the deflected spring arms 34.

Figure 3:
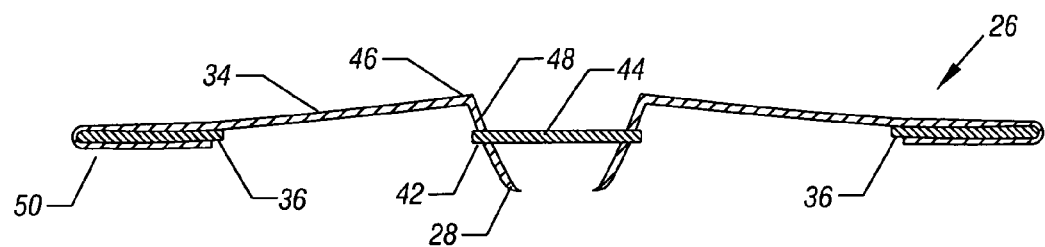
FIG. 3 is a cross-sectional view taken generally along the line 3-3 in FIG. 2 in accordance with one embodiment of the present invention.

Referring to FIG. 3, the spring arms 34 may be formed of a separate metal sheet secured to the base 36 by wrapping portions 50, each integral with a spring arm 34, about the base 36. The portions 50 may then be crimped, soldered, or adhesively secured to the base 36, to mention a few examples. A tab 60 on the base 36 may extend through an opening 62 in each sheet 64 to align the base 36 with the spring arms 34. The apex 46 of a spring arm 34 may include the downwardly extending fingers 48. As shown in FIG. 3, each finger 48 may be guided by a prong 42 of the raised section 44 of the base 36. Each spring arm 34 may also have a turned away end 28.

Figure 4:
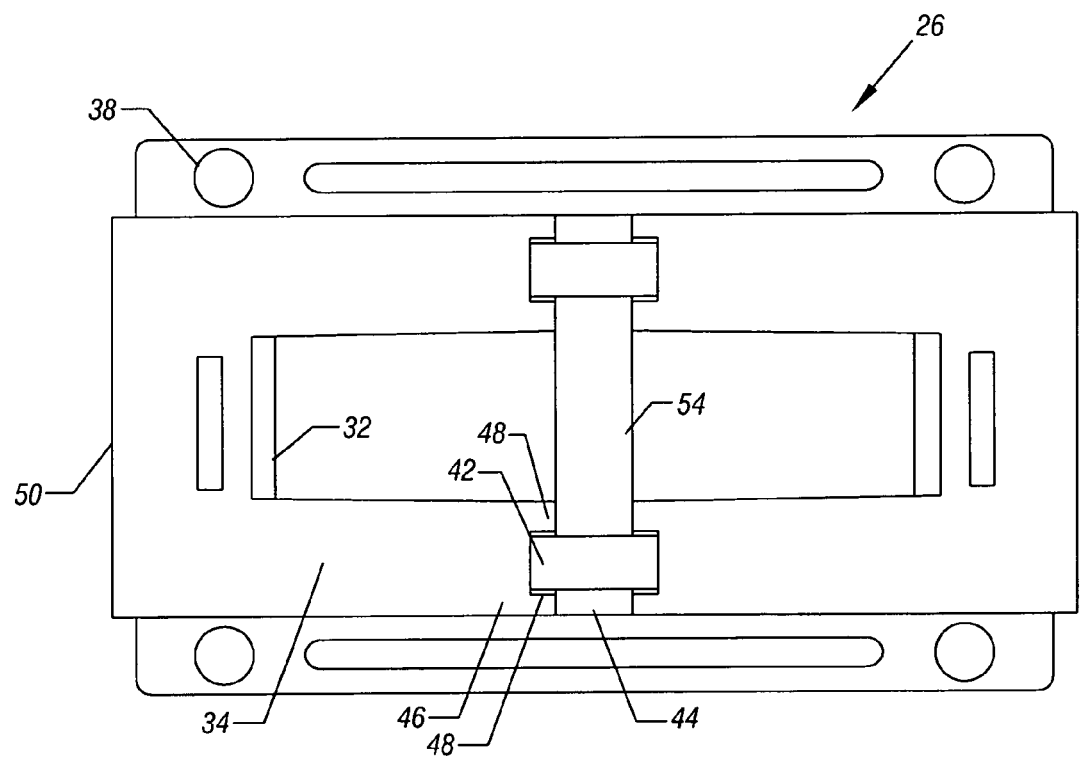
FIG. 4 is an enlarged, top plan view of the embodiment shown in FIG. 2.

Moving to FIG. 4, the engagement between the fingers 48 and the prongs 42 is indicated for one embodiment. Thus, in FIG. 4, the spring arms 34 move up and down, but side-to-side motion is prevented by the prongs 42 which guide the motion of the cantilevered leaf spring arms 34 and, particularly, their fingers 48.

The spring arms 34 are preloaded. The preloading is achieved by spacing those spring arms from the board 30 by a distance less than the vertical extent of the arms 30 in their free state. If the arms were released, they would spring upwardly, in one embodiment until their upturned ends 28 extended above the raised section 44. Instead, the spring arms 34 are pre-stressed or preloaded so that they have advantageous characteristics in operation.

It is desirable that the spring assembly 26 fit between the printed circuit board 30 and a chassis 24, in one embodiment, with a gap as small as five millimeters or less to provide the desired bottom loading. That bottom loading may be as high as 150 pounds, in some embodiments, to compress the integrated circuit 23 and socket 22 against the heat sink base 12. The board 30 deflection may be limited as much as possible during assembly to prevent failures such as via or solder ball cracking. The need to position the spring assembly 26 in a small space and limit board deflection suggests that the spring arms 34 be relatively stiff.

On the other hand, it is also desirable to reduce the load variation under all dimensional stack up conditions. Regardless of spring installed height variation, the spring load advantageously is as close to its designed value as possible. Excessive load may cause package failure, while an insufficient load does not guarantee full mating with socket contacts. In addition, compression contact sockets, such as land grid array sockets, require that the load be maintained throughout the life of the product. Loss of load due to plastic components and solder ball failure should be reduced if possible. Thus, the need to account for spring installed height variations and to maintain contact over the life of the spring, suggests that the spring arms 34 should be made as soft as possible.

These conflicting goals can be accommodated by using relative soft spring arms and then preloading the spring arms 34 to a load level that is close to the design load value. For example, if the design load value is 150 lbs, the spring arms can be preloaded to 140 lbs. Upon assembly the printed circuit board 30 only needs to deflect the spring arms by a small displacement which corresponds to the difference between the design load and the preload (which is 10 lbf difference in the example above).

A non-preloaded spring may exhibit a wide variation of load over the thickness tolerance stack-up. The preloaded spring may maintain a minimum load, have less load variation due to thickness tolerance stack, and require minimum board deflection during installation, in some embodiments.

In another embodiment, the base 36 may be part of the chassis 24. Then the spring arms 34 can be preloaded directly onto the chassis 24.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A heat sink assembly comprising:
   a printed circuit board having a pair of opposed sides;
   a heat sink secured on one side of said printed circuit board; and
   a preloaded spring assembly on the opposite side of said circuit board, said spring assembly including two separate springs arranged in parallel.

2. The assembly of claim 1 wherein said spring assembly includes spring arms biased against said circuit board.

3. The assembly of claim 2 wherein said spring assembly includes a base, said spring arms mounted on said base, said base including guides to reduce side-to-side motion of said spring arms.

4. The assembly of claim 1 wherein said spring assembly includes a first piece with a pair of preloaded spring arms and a second piece to mount said spring arms.

5. The assembly of claim 4 wherein said pieces have different resiliency.

6. The assembly of claim 1 wherein said spring assembly may be mounted in a space of 5 millimeters or less.

7. The assembly of claim 2 wherein said spring assembly is mounted sufficiently close to said printed circuit board that the spring arms of said spring assembly are biased away from their free state by the imposition of the printed circuit board.

8. The assembly of claim 1 including the spring assembly made up of at least three pieces, including two spring arm portions formed of a first material and a base formed of a second material, said spring arm portions being attached to said base.

9. The assembly of claim 1 including pins extending from said heat sink through said printed circuit board and attached to said preloaded spring assembly.

10. The assembly of claim 1 including the spring assembly that fits within a space of 5 millimeters or less while accommodating for a load variation under different stack up conditions.

11. A heat sink assembly comprising:
    a printed circuit board having a pair of opposed sides;
    a heat sink secured on one side of said printed circuit board; and
    a preloaded spring assembly on the opposite side of said circuit board, said spring assembly including at least one substantially flat, planar spring.

12. The assembly of claim 11 wherein said spring includes an angled arm on the end of said spring.

13. The assembly of claim 12 including a guide to guide said spring using said arm.

14. The assembly of claim 11 wherein said preloaded spring assembly includes a pair of opposed, separate springs.

15. The assembly of claim 14 wherein said heat sink assembly includes a base and said springs are coupled to said base.

16. The assembly of claim 14 wherein said springs are arranged in parallel.

* * * * *